(12) United States Patent
Wang et al.

(10) Patent No.: US 10,269,490 B2
(45) Date of Patent: Apr. 23, 2019

(54) METAL-OXIDE-METAL CAPACITOR USING VIAS WITHIN SETS OF INTERDIGITATED FINGERS

(71) Applicant: QUALCOMM Incorporated, San Diego, CA (US)

(72) Inventors: Kevin Jia-Nong Wang, Poway, CA (US); Chao Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/687,234

(22) Filed: Aug. 25, 2017

(65) Prior Publication Data

US 2018/0315548 A1    Nov. 1, 2018

Related U.S. Application Data

(60) Provisional application No. 62/492,775, filed on May 1, 2017.

(51) Int. Cl.
*H01G 4/012*    (2006.01)
*H01G 4/248*    (2006.01)

(52) U.S. Cl.
CPC ............. *H01G 4/012* (2013.01); *H01G 4/248* (2013.01)

(58) Field of Classification Search
CPC .................... H01G 4/012; H01G 4/248
USPC ......................................................... 361/304
See application file for complete search history.

(56) References Cited

U.S. PATENT DOCUMENTS

| | | | |
|---|---|---|---|
| 7,859,039 B2 | 12/2010 | Yeh | |
| 7,994,610 B1 | 8/2011 | Quinn | |
| 8,378,450 B2 | 2/2013 | Booth, Jr. et al. | |
| 8,558,228 B2 | 10/2013 | Chen et al. | |
| 8,836,079 B2 | 9/2014 | Li et al. | |
| 2010/0127347 A1* | 5/2010 | Quinn | H01L 23/5223 257/532 |
| 2012/0119326 A1 | 5/2012 | Sugisaki et al. | |
| 2014/0203401 A1* | 7/2014 | Li | H01L 23/5223 257/532 |

* cited by examiner

*Primary Examiner* — Michael P McFadden
(74) *Attorney, Agent, or Firm* — Qualcomm Incorporated/Seyfarth Shaw LLP (57) ABSTRACT

A capacitor may include a first set of conductive fingers interdigitated with a second set of conductive fingers at an interconnect layer in a preferred direction of the interconnect layer. The capacitor may also include the first set of conductive fingers interdigitated with the second set of conductive fingers at a next interconnect layer in the preferred direction of the next interconnect layer. The capacitor may further include a first set of through finger vias electrically coupling the first set of conductive fingers of the interconnect layer to the first set of conductive fingers of the next interconnect layer.

10 Claims, 8 Drawing Sheets

METAL-OXIDE-METAL CAPACITOR USING VIAS WITHIN SETS OF INTERDIGITATED FINGERS

CROSS-REFERENCE TO RELATED APPLICATION

This application claims the benefit of U.S. Provisional Patent Application No. 62/492,775, filed on May 1, 2017, entitled "METAL-OXIDE-METAL CAPACITOR USING VIAS WITHIN SETS OF INTERDIGITATED FINGERS," the disclosure of which is expressly incorporated by reference herein in its entirety.

BACKGROUND

Technical Field

Aspects of the present disclosure relate to semiconductor devices, and more particularly to metal-oxide-metal (MOM) capacitors using vias within sets of interdigitated fingers.

Background

Capacitors are widely used in integrated circuits (ICs). For example, analog integrated circuits use various types of integrated capacitors. These integrated capacitors may include metal-oxide-semiconductor (MOS) capacitors, p-n junction capacitors, metal-insulator-metal (MIM), poly-to-poly capacitors, metal-oxide-metal (MOM) capacitors, and other like capacitor structures. MOM capacitors are also known as vertical parallel plate (VPP) capacitors, natural vertical capacitors (NVCAP), lateral flux capacitors, comb capacitors, as well as interdigitated finger capacitors. MOM capacitors exhibit beneficial characteristics including high capacitance density, low parasitic capacitance, superior radio frequency (RF) characteristics, and good matching characteristics without additional masks or process steps relative to other capacitor structures.

MOM capacitors are one of the most widely used capacitors due to their noted beneficial characteristics. In particular, MOM capacitors may be used as high quality capacitors in semiconductor processes without incurring the cost of an extra processing step relative to other capacitor structures. MOM capacitor structures realize capacitance by using the fringing capacitance produced by sets of interdigitated fingers. That is, MOM capacitors harness lateral capacitive coupling between plates formed by metallization layers and wiring traces.

This lateral capacitive coupling provides better matching characteristics than vertical coupling due to improved process control over lateral dimensions within an interconnect stack. By contrast, the process controls of the vertical dimensions of the conductive interconnect and dielectric layer thickness within the interconnect stack are less precise. Furthermore, it is becoming significantly more challenging to fabricate high density capacitance.

Moreover, in highly advanced processes, interconnect layers (e.g., metals) have preferential directions. That is, more permissive rules apply (e.g., width and/or spacing) when interconnect layers are running in a preferred direction. As a result, conventional MOM capacitor structures are subject to more restrictive rules. Consequently, conventional MOM capacitors may be insufficient to provide high density capacitance for IC devices in future process technologies.

SUMMARY

A capacitor may include a first set of conductive fingers interdigitated with a second set of conductive fingers at an interconnect layer in a preferred direction of the interconnect layer. The capacitor may also include the first set of conductive fingers interdigitated with the second set of conductive fingers at a next interconnect layer in the preferred direction of the next interconnect layer. The capacitor may further include a first set of through finger vias electrically coupling the first set of conductive fingers of the interconnect layer to the first set of conductive fingers of the next interconnect layer.

A method for fabricating a capacitor structure may include fabricating a first set of conductive fingers interdigitated with a second set of conductive fingers at an interconnect layer in a preferred direction of the interconnect layer. The method may also include fabricating the first set of conductive fingers interdigitated with the second set of conductive fingers at a next interconnect layer in the preferred direction of the next interconnect layer. The method may further include electrically coupling the first set of conductive fingers of the interconnect layer to the first set of conductive fingers of the next interconnect layer with a first set of through finger vias.

A 3D mesh capacitor structure may include a first set of conductive fingers interdigitated with a second set of conductive fingers at an interconnect layer in a preferred direction of the interconnect layer. The 3D mesh capacitor structure may also include the first set of conductive fingers interdigitated with the second set of conductive fingers at a next interconnect layer in the preferred direction of the next interconnect layer. The 3D mesh capacitor structure may further include the first set of conductive fingers interdigitated with the second set of conductive fingers at a subsequent interconnect layer, orthogonal to the preferred direction of the next interconnect layer.

The 3D mesh capacitor structure may also include a first set of through finger vias electrically coupling the first set of conductive fingers of the interconnect layer to the first set of conductive fingers of the next interconnect layer and the first set of conductive fingers of the subsequent interconnect layer in a first 3D mesh. The 3D mesh capacitor structure may further include a second set of through finger vias electrically coupling the second set of conductive fingers of the interconnect layer to the second set of conductive fingers of the next interconnect layer and the second set of conductive fingers of the subsequent interconnect layer in a second 3D mesh.

A capacitor may include a first set of conductive fingers interdigitated with a second set of conductive fingers at an interconnect layer in a preferred direction of the interconnect layer. The capacitor may also include the first set of conductive fingers interdigitated with the second set of conductive fingers at a next interconnect layer in the preferred direction of the next interconnect layer. The capacitor may further include first means for electrically coupling the first set of conductive fingers of the interconnect layer to the first set of conductive fingers of the next interconnect layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Capacitors are widely used in integrated circuits. For example, analog integrated circuits use various types of integrated capacitors. These integrated capacitors may include metal-oxide-semiconductor (MOS) capacitors, p-n junction capacitors, metal-insulator-metal (MIM), poly-to-poly capacitors, metal-oxide-metal (MOM) capacitors, and other like capacitor structures. Capacitors are generally passive elements used in integrated circuits for storing an electrical charge. For example, parallel plate capacitors are often made using plates or structures that are conductive with an insulating material between the plates. The amount of storage, or capacitance, for a given capacitor is contingent upon the materials used to make the plates and the insulator, the area of the plates, and the spacing between the plates. The insulating material is often a dielectric material.

These parallel plate capacitors, however, often take up a large area on a semiconductor chip because many designs place the capacitors over the substrate of the chip. Unfortunately, this approach takes up a large amount of substrate area, which reduces the available area for active devices. Another approach creates a vertical structure, which may be known as a vertical parallel plate (VPP) capacitor. A VPP capacitor structure may be created through stacking of the interconnect layers on a chip.

VPP capacitors structures, however, have lower capacitive storage, or lower "density," in that these structures do not store much electrical charge. In particular, the interconnect and via layer interconnect traces used to fabricate VPP capacitors may be very small in size. The spacing between the interconnect and via layer conductive traces in VPP structures is limited by design rules, which often results in a large area for achieving certain desired capacitance for such structures. Although described as "vertical," these structures can be in any direction that is substantially perpendicular to the surface of the substrate, or at other angles that are not substantially parallel to the substrate.

A MOM capacitor is one example of a VPP capacitor. MOM capacitors are one of the most widely used capacitors due to their noted beneficial characteristics. In particular, MOM capacitors may be used as high quality capacitors in semiconductor processes without incurring the cost of an extra processing step relative to other capacitor structures. MOM capacitor structures realize capacitance by using the fringing capacitance produced by sets of interdigitated fingers. That is, MOM capacitors harness lateral capacitive coupling between plates formed by metallization layers and wiring traces. It should be noted that some metallizations also harness vertical coupling, though to a lesser degree.

This lateral capacitive coupling used by MOM capacitors provides better matching characteristics than vertical coupling due to improved process control over lateral dimensions within an interconnect stack. By contrast, the process controls of the vertical dimensions of the conductive interconnect and dielectric layer thickness within the interconnect stack are less precise. As a result, it is becoming significantly more challenging to fabricate high density capacitance.

Moreover, in highly advanced processes, interconnect layers (e.g., metals) have preferential directions. That is, more permissive rules apply (e.g., width and/or spacing) when interconnect layers are running in a preferred direction. By contrast, conventional MOM capacitors have sets of interdigitated fingers that are generally connected together with respective endcaps that are orthogonal to the sets of interdigitated fingers. As a result, conventional MOM capacitor structures are subject either the endcaps or the interdigitated fingers to more restrictive rules. Consequently, conventional MOM capacitor structures may be insufficient to provide high density capacitance for IC devices in future process technologies.

Advances in lithography have substantially reduced line spacing (e.g., to less than 20 nanometers) on integrated circuits. The use of the reduced line spacing increases the available area for capacitance because more lines of charge storage can be placed in the same volume of material, which is beneficial for MOM capacitor structures. The use of vertical structures, as described in the present disclosure, allow for a MOM capacitor structure using interdigitated sets of fingers that run in a preferred direction to comply with highly advanced processes.

Various aspects of the disclosure provide a capacitor structure (e.g., a MOM capacitor) using vias within sets of interdigitated fingers arranged according to a preferred direction. The process flow for fabricating a 3D mesh capacitor structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced.

As described, the back-end-of-line interconnect layers may refer to the conductive interconnect layers (e.g., metal one (M1), metal two (M2), metal three (M3), metal four (M4), etc.) for electrically coupling to front-end-of-line active devices of an integrated circuit. The back-end-of-line interconnect layers may electrically couple to middle-of-line interconnect layers for, for example, connecting M1 to an oxide diffusion (OD) layer of an integrated circuit. A back-end-of-line first via (V2) may connect M2 to M3 or others of the back-end-of-line interconnect layers.

Aspects of the present disclosure describe a 3D mesh capacitor structure that removes an endcap for sets of interdigitated conductive fingers. This arrangement allows removal of non-preferred interconnect layers. According to aspects of the present disclosure, each set of interdigitated conductive fingers within a layer of a MOM capacitor is coupled together by vias within and through the inner conductive fingers. That is, these layers of interdigitated conductive fingers are no longer connected together through an endcap, as in conventional designs. Removal of the endcaps results in the removal of non-preferred interconnect layers, which beneficially reduces capacitor area.

Figure 1:
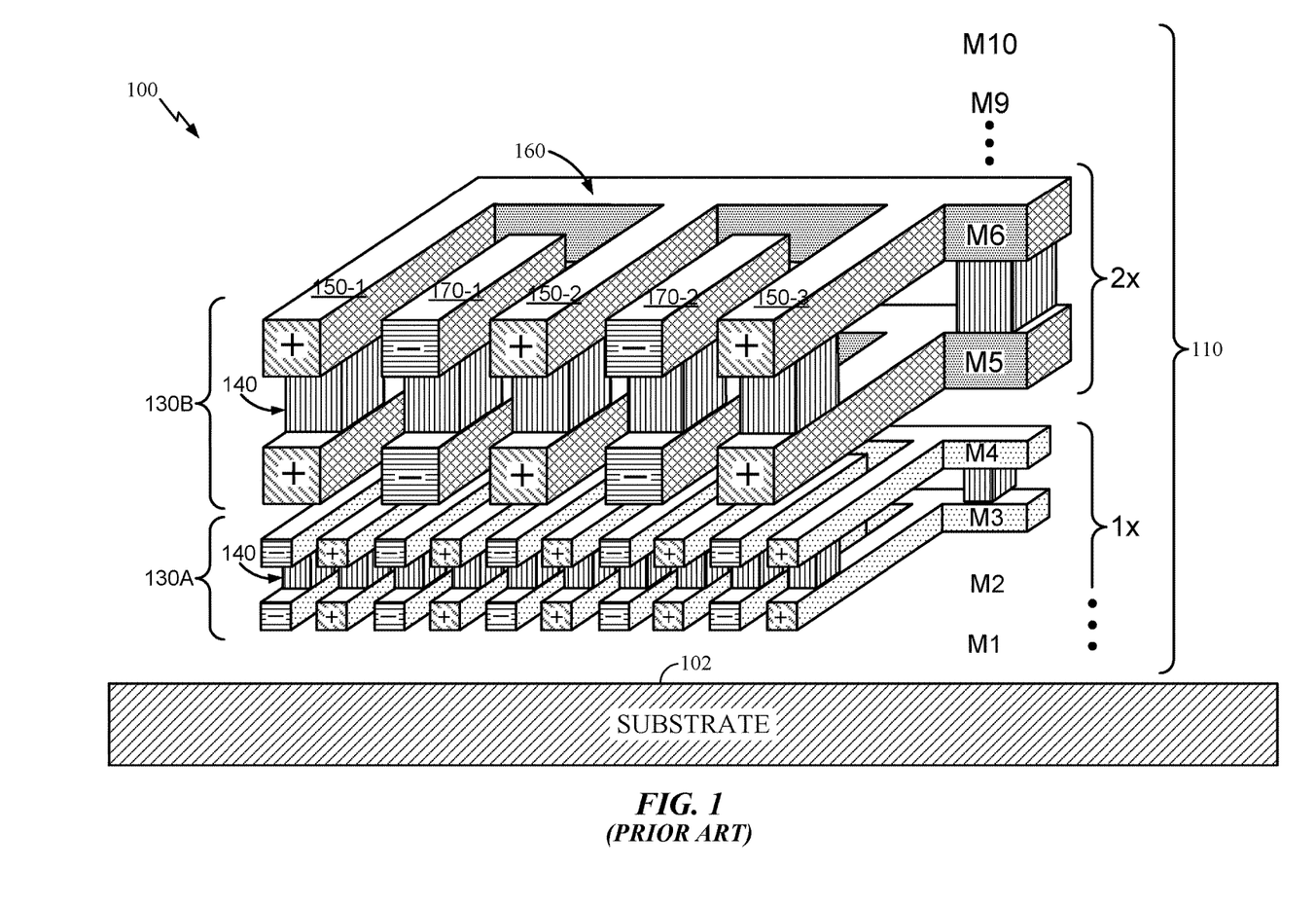
FIG. 1 is a cross-section illustrating an integrated circuit (IC) device including an interconnect stack that contains conventional metal-oxide-metal (MOM) capacitor structures.

Capacitors are widely used in integrated circuits. FIG. 1 is a block diagram illustrating a cross-section of an integrated circuit (IC) device 100 including an interconnect stack 110. The interconnect stack 110 of the IC device 100 includes multiple conductive interconnect layers (M1, . . . , M9, M10) on a semiconductor substrate (e.g., a diced silicon wafer) 102. The semiconductor substrate 102 supports metal-oxide-metal (MOM) capacitors 130. In this example, a first MOM capacitor 130A is formed in the M3 and M4 interconnect layers, and a second MOM capacitor 130B is formed in the M5 and M6 interconnect layers. The MOM capacitors 130 (130A and 130B) are formed from lateral conductive fingers of different polarities using the conductive interconnect layers (M3 and M4/M5 and M6) of the interconnect stack 110. A dielectric (not shown) is provided between the conductive fingers.

In this example, the MOM capacitors 130 are formed within the lower conductive interconnect layers (e.g., M1-M6) of the interconnect stack 110. The lower conductive interconnect layers of the interconnect stack 110 have smaller interconnect widths and spaces. For example, the dimensions of the conductive interconnect layers M3 and M4 are half the size of the dimensions of the conductive interconnect layers M5 and M6. Likewise, the dimensions of the conductive interconnect layers M1 and M2 are half the size of the dimensions of the conductive interconnect layers M3 and M4. The small interconnect widths and spaces of the lower conductive interconnect layers enable the formation of MOM capacitors with increased capacitance density.

As shown in FIG. 1, the MOM capacitors 130 make use of a lateral (intra layer) capacitive coupling 140 between fingers (e.g., 150, 170) formed by standard metallization of the conductive interconnects (e.g., wiring lines and vias). The lateral coupling 140 within the MOM capacitors 130 provides improved matching characteristics when compared to the vertical coupling of parallel vertical plate capacitors. The improved matching characteristics of the MOM capacitors 130 are the result of improved process control of the lateral dimensions within the interconnect stack 110. By contrast, the process controls of the vertical dimensions of the conductive interconnect and dielectric layer thickness within the interconnect stack 110 are less precise for fabricating parallel plate capacitors.

A first set of fingers 150 (150-1, 150-2, 150-3) is interdigitated with a second set of fingers 170 (170-1, 170-2) to provide capacitive coupling for the second MOM capacitor 130B. In this conventional arrangement, the first set of fingers 150 are electrically coupled through a first endcap 160. In highly advanced processes, however, interconnect layers (e.g., metals) have preferential directions. That is, more permissive design rules apply (e.g., width and/or spacing design rules) when interconnect layers are running in a preferred direction. In conventional MOM capacitors (e.g., the MOM capacitors 130), the first endcap 160 is orthogonal to both the first set of fingers 150 and the second set of fingers 170. As a result, either the first endcap 160 or the first set of fingers 150 are subjected to more restrictive design rules. Consequently, conventional MOM capacitors may be insufficient to provide high density capacitance for IC devices in future process technologies.

Figure 2A:
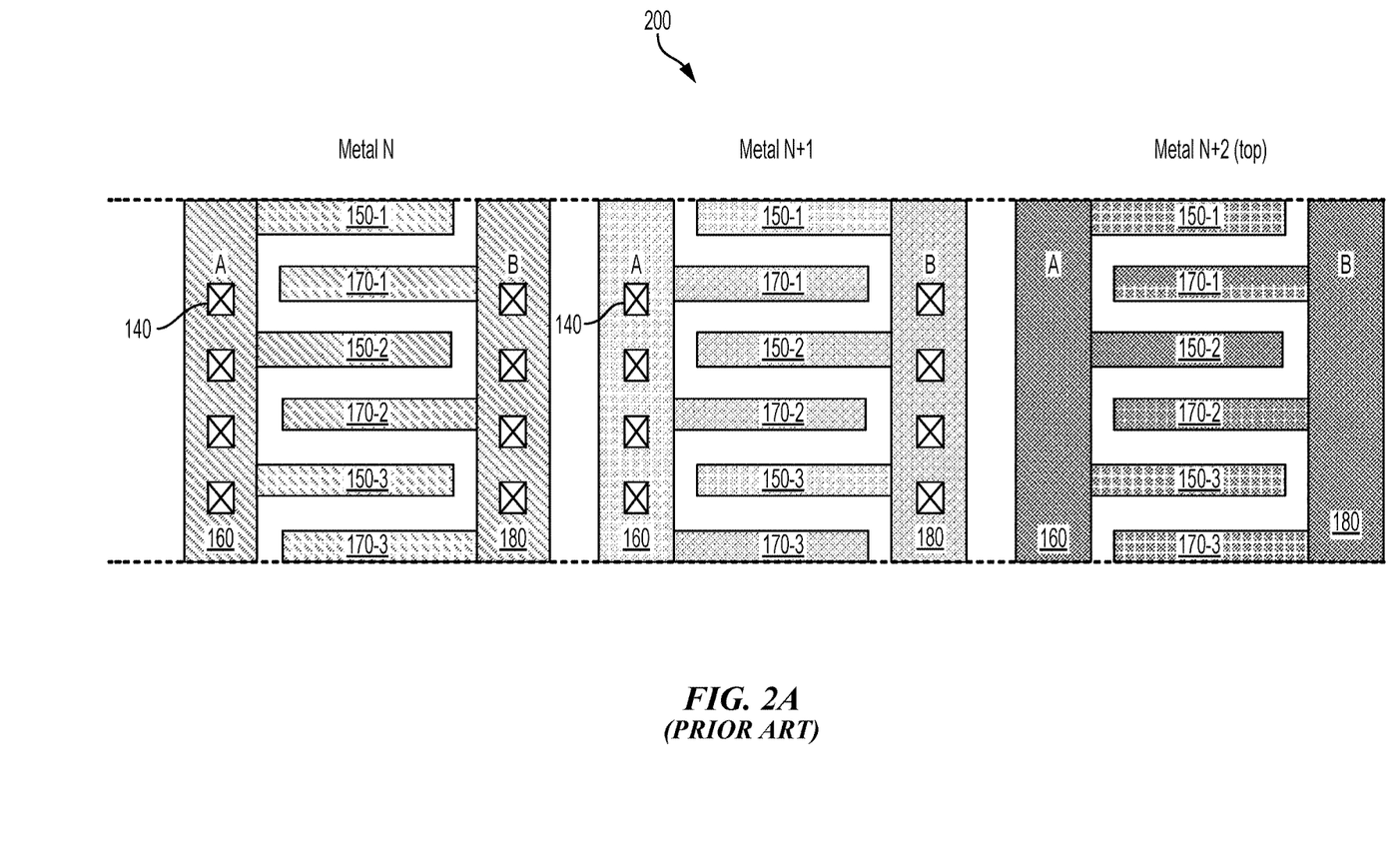
FIG. 2A illustrates a top-down view of layers of a conventional MOM capacitor structure.

FIG. 2A illustrates a top-down view of layers of a conventional MOM capacitor structure 200. Representatively, the conventional MOM capacitor structure 200 includes a first interconnect layer (Metal N), a second interconnect layer (Metal N+1), and a third interconnect layer (Metal N+2). Each of the interconnect layers includes a first set of fingers 150 (150-1, 150-2, 150-3) interdigitated with a second set of fingers 170 (170-1, 170-2, 170-3) to provide capacitive coupling for the conventional MOM capacitor structure 200. In this conventional arrangement, the first set of fingers 150 are electrically coupled through a first endcap 160. Similarly, the second set of fingers 170 are electrically coupled through a second endcap 180. In addition, the sets of interdigitated fingers extend in the same direction for each interconnect layer, rather than the preferred direction of the respective interconnect layer. Vias 140 connect Metal N to Metal N+1, and Metal N+1 to Metal N+2.

Figure 2B:
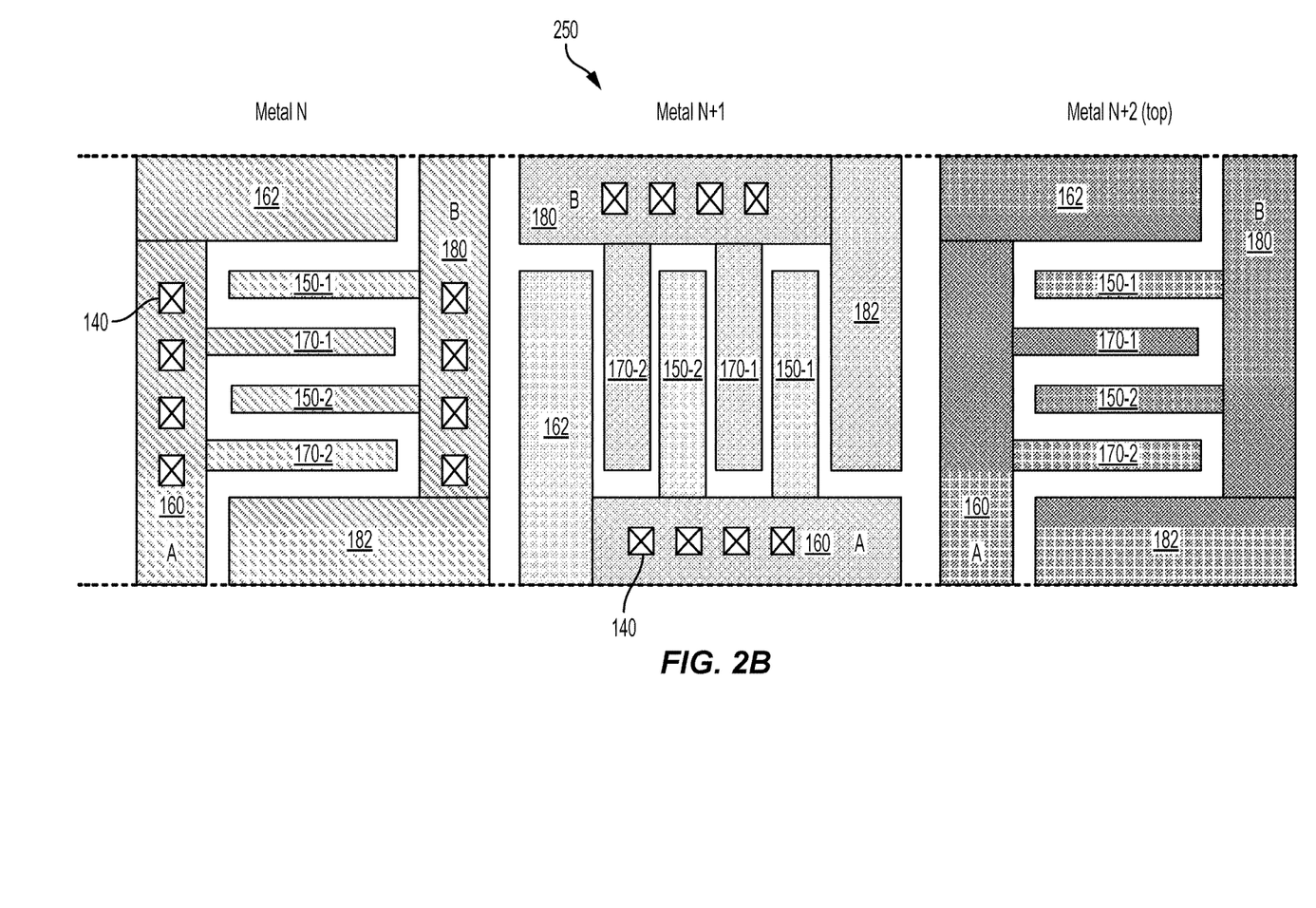
FIG. 2B illustrates a top-down view of layers of a MOM capacitor structure in which the sets of interdigitated fingers are extended in a preferred direction of a respective interconnect layer.

FIG. 2B illustrates a top-down view of layers of a MOM capacitor structure 250, in which the sets of interdigitated fingers extend in a preferred direction of a respective interconnect layer. Similar to FIG. 2A, each of the interconnect layers includes the first set of fingers 150 interdigitated with the second set of fingers 170. In addition, the first set of fingers 150 are electrically coupled through the first endcap 160, and the second set of fingers 170 are electrically coupled through the second endcap 180. The second endcap 180 is distal from the first endcap 160 in this example. The Metal N layer and the Metal N+2 layer have a horizontal preferred direction. By contrast, the Metal N+1 layer has a vertical preferred direction. The vias 140 also connect Metal N to Metal N+1, and Metal N+1 to Metal N+2.

In contrast to FIG. 2A, the first set of fingers 150 and the second set of fingers 170 of FIG. 2B extend in a preferred direction for their corresponding interconnect layer (e.g., Metal N, Metal N+1, or Metal N+2). In addition, each of the first endcap 160 and the second endcap 180 includes a portion (e.g., 162/182) that extends in the preferred direction of the respective interconnect layer. Unfortunately, the first endcap 160 and the second endcap 180 are orthogonal to the preferred direction and are therefore subject to more rigid design rules.

Figure 3A:
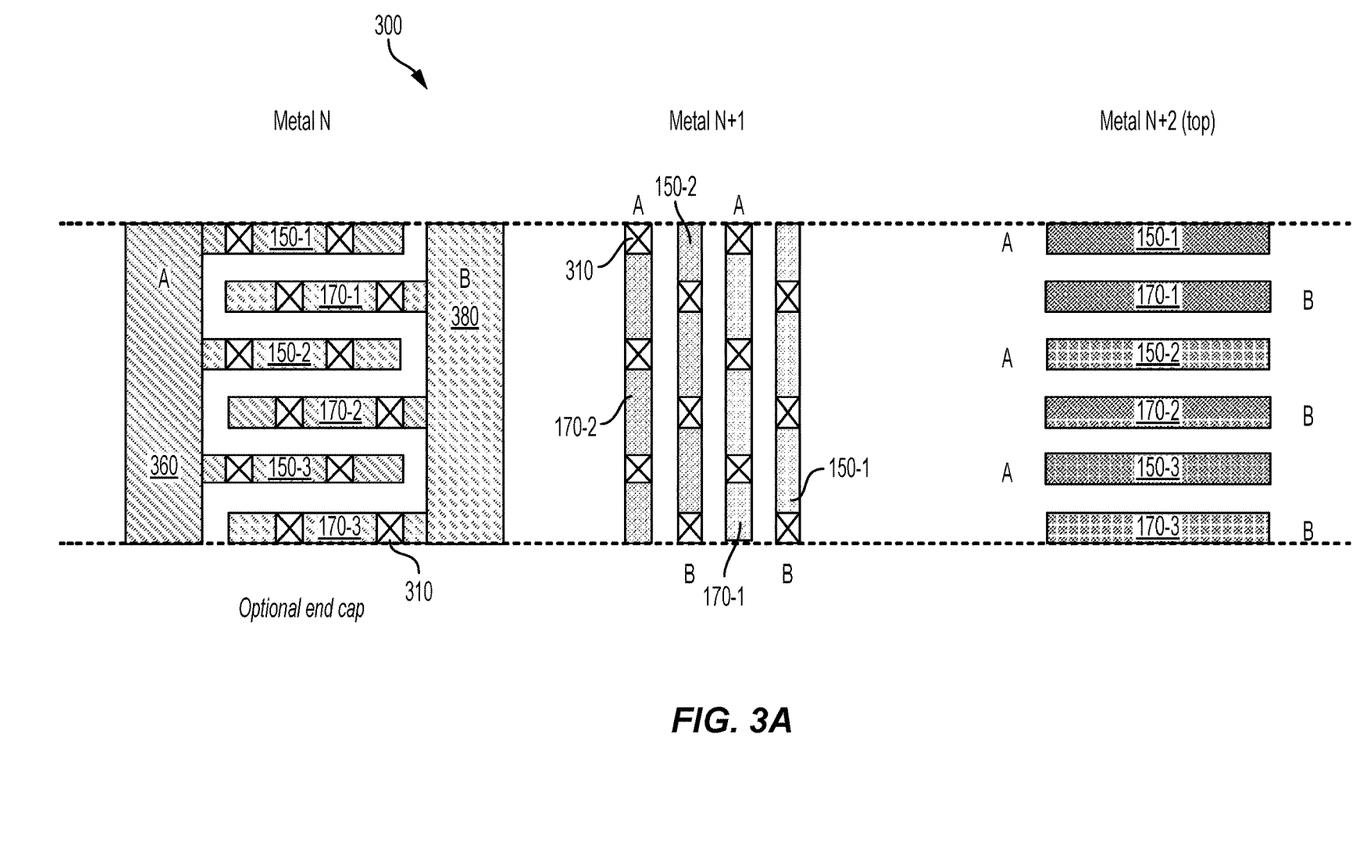
FIG. 3A illustrates a MOM capacitor using vias within sets of interdigitated fingers extended in a preferred direction in accordance with aspects of the present disclosure.

FIG. 3A illustrates a MOM capacitor 300 using through finger vias 310 within sets of interdigitated fingers extending in a preferred direction in accordance with aspects of the present disclosure. Similar to FIG. 2B, the first set of fingers 150 and the second set of fingers 170 extend in a preferred direction (e.g., either vertical or horizontal) for their corresponding interconnect layer. As in FIG. 2B, the Metal N layer and the Metal N+2 layer have a horizontal preferred direction, and the Metal N+1 layer has a vertical preferred direction. As a result, the first set of fingers 150 and the second set of fingers 170 are subject to relaxed design rules.

The layers of the MOM capacitor 300, however, are electrically coupled together using though finger vias 310. Representatively, the first set of fingers 150 are electrically coupled with the though finger vias 310 to form a 3D mesh structure through each of the interconnect layers (e.g., (e.g., Metal N, Metal N+1, or Metal N+2). Similarly, the second set of fingers 170 are also electrically coupled by the though finger vias 310 to form a 3D mesh structure among the interconnect layers. In addition, a first endcap 360 and a second endcap 380 are removed from the Metal N+1 interconnect layer (e.g., next interconnect layer) and the Metal N+2 interconnect layer (e.g., subsequent interconnect layer) of the MOM capacitor 300.

Although a first endcap 360 and a second endcap 380 remain in the Metal N interconnect layer, the first endcap 360 and the second endcap 380 may be removed or placed in another of the interconnect layers (e.g., Metal N+1 and/or Metal N+2). For example, the endcaps (e.g., 360/380) can be in the top (e.g., Metal N+2) and the bottom (e.g., Metal N) layers, but not in the middle (e.g., Metal N+1) layer. If circuitry is underneath the lowest layer (e.g., Metal N) of the MOM capacitor 300, an endcap is not provided for the lowest layer (e.g., Metal N), for example, as shown in FIG. 3B.

Figure 3B:
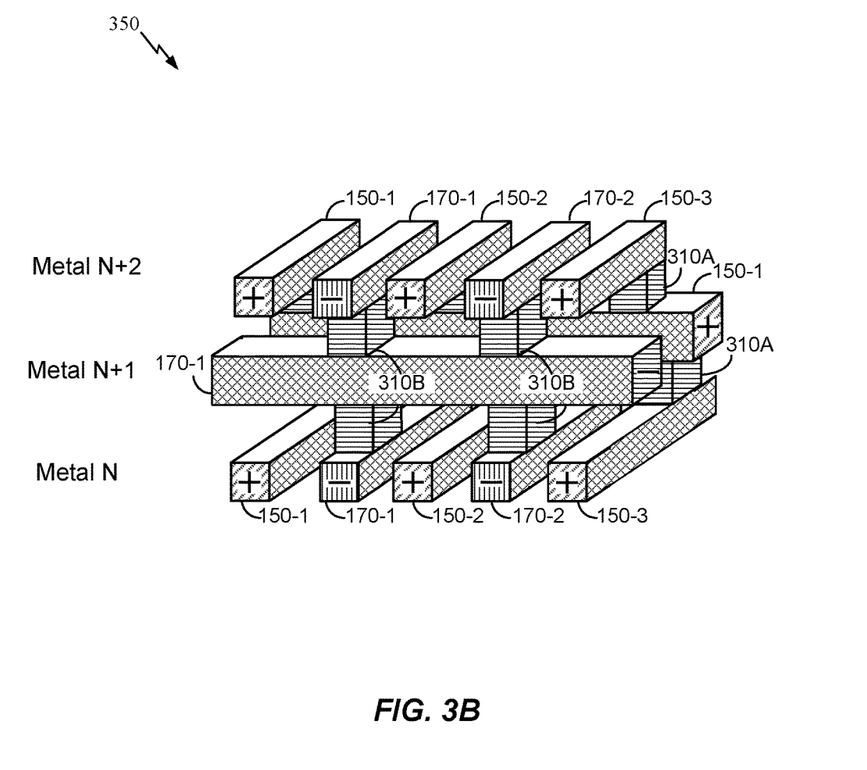
FIG. 3B illustrates a 3D mesh capacitor structure using vias within sets of interdigitated fingers arranged according to a preferred direction in accordance with aspects of the present disclosure.

FIG. 3B illustrates a 3D mesh capacitor structure 350 in accordance with aspects of the present disclosure. The 3D mesh capacitor structure 350 may include a first set of through finger vias 310A and a second set of through finger vias 310B within sets of interdigitated fingers extending in a preferred direction. Similar to FIG. 3A, the first set of fingers 150 (150-1, 150-2, 150-3) and the second set of fingers 170 (170-1, 170-2) extend in a preferred direction (e.g., horizontal or orthogonal) for their corresponding interconnect layer. As in FIG. 3A, the Metal N layer and the Metal N+2 layer have an orthogonal preferred direction, and the Metal N+1 layer has a horizontal preferred direction. As a result, the first set of fingers 150 and the second set of fingers 170 are subject to relaxed design rules.

In this example, the capacitor layers are electrically coupled together using the first set of though finger vias 310A and the second set of through finger vias 310B to form the 3D mesh capacitor structure 350 without the first endcap 360 or the second endcap 380 shown in FIG. 3A. Representatively, the first set of fingers 150 are electrically coupled with the first set of though finger vias 310A through each of the interconnect layers (e.g., Metal n, Metal N+1, or Metal N+2). Similarly, the second set of fingers 170 are also electrically coupled by the second set of though finger vias 310B to complete the 3D mesh capacitor structure 350. In aspects of the present disclosure, the 3D mesh capacitor structure 350 is supported by active circuitry (not shown) below a lowest interconnect layer (e.g., Metal N).

This aspect of the present disclosure removes non-preferred interconnect layers, such as the first endcap 360 and the second endcap 380 of FIG. 3A. Removing the non-preferred interconnect layers enables additional conductive fingers for increasing capacitance per unit area. In one configuration, the first set of fingers 150 are electrically coupled as a first terminal of the 3D mesh capacitor structure 350, and the second set of fingers 170 are electrically coupled as a second terminal of the 3D mesh capacitor structure 350. Although shown as including three interconnect layers (e.g., Metal N, Metal N+1, and Metal N+2), it should be recognized that aspects of the present disclosure may include additional or fewer interconnect layers, such as a further interconnect layer (e.g., Metal N+3).

Figure 4:
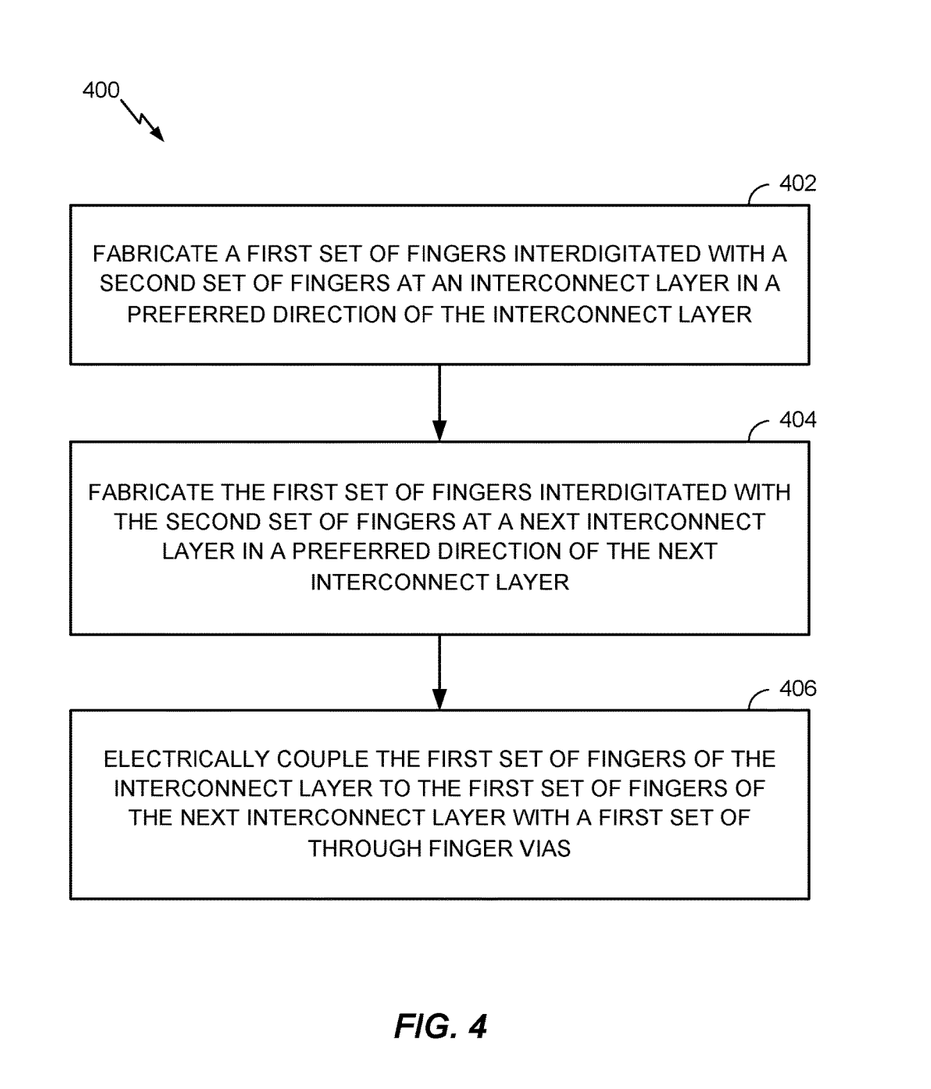
FIG. 4 is a process flow diagram illustrating a method for fabricating a MOM capacitor structure according to an aspect of the present disclosure.

FIG. 4 is a process flow diagram illustrating a method 400 for fabricating a capacitor structure according to an aspect of the present disclosure. In block 402, a first set of fingers and a second set of fingers are fabricated and interdigitated at an interconnect layer and in a preferred direction of the interconnect layer. The first set of fingers and the second set of fingers may be, for example, the first set of fingers 150 interdigitated with a second set of fingers 170 of the Metal N interconnect layer shown in FIG. 3A or 3B. In block 404, the first set of fingers and the second set of fingers are fabricated and interdigitated at a next interconnect layer and in a preferred direction of the next interconnect layer. The first set of fingers and the second set of fingers may be, for example, the first set of fingers 150 interdigitated with a second set of fingers 170 of the Metal N+1 interconnect layer shown in FIG. 3A or 3B. In block 406, the first set of fingers of the interconnect layer are electrically coupled to the first set of fingers of the next interconnect layer with through finger vias. For example, as shown in FIG. 3B, the first set of fingers 150 of the Metal N interconnect layer are electrically coupled to the first set of fingers 150 of the Metal N+1 interconnect layer with the first through finger vias 310A and the second through finger vias 310B to form the 3D mesh capacitor structure 350.

According to a further aspect of the present disclosure, a MOM capacitor structure is described. In one configuration, the MOM capacitor structure includes a first means for electrically coupling a first set of fingers of an interconnect layer to the first set of fingers of a next interconnect layer. In one configuration, the first electrically coupling means may be the first set of though finger vias 310A, as shown in FIGS. 3A and 3B. The MOM capacitor structure may also include a second means for electrically coupling a second set of fingers of the interconnect layer to the second set of fingers of the next interconnect layer. In one configuration, the second electrically coupling means may be the second set of though finger vias 310B, as shown in FIGS. 3A and 3B. In another aspect, the aforementioned means may be any structure or any material configured to perform the functions recited by the aforementioned means.

Figure 5:
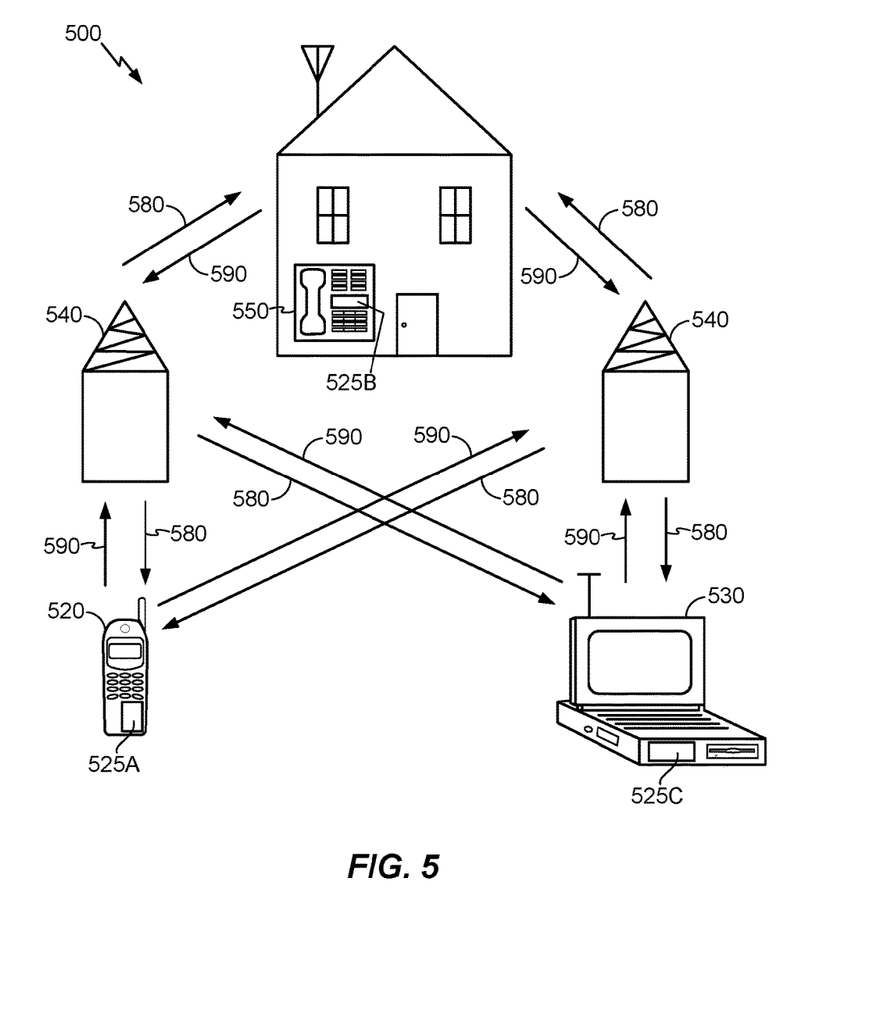
FIG. 5 is a block diagram showing an exemplary wireless communication system in which a configuration of the disclosure may be advantageously employed.

FIG. 5 is a block diagram showing an exemplary wireless communication system 500 in which an aspect of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525A, 525C, and 525B that include the disclosed MOM capacitors. It will be recognized that other devices may also include the disclosed MOM capacitors, such as the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as a meter reading equipment, or other device that stores or retrieves data or computer instructions, or combinations thereof. Although FIG. 5 illustrates remote units according to the aspects of the disclosure, the disclosure is not limited to these exemplary illustrated units. Aspects of the disclosure may be suitably employed in many devices, which include the disclosed MOM capacitors.

Figure 6:
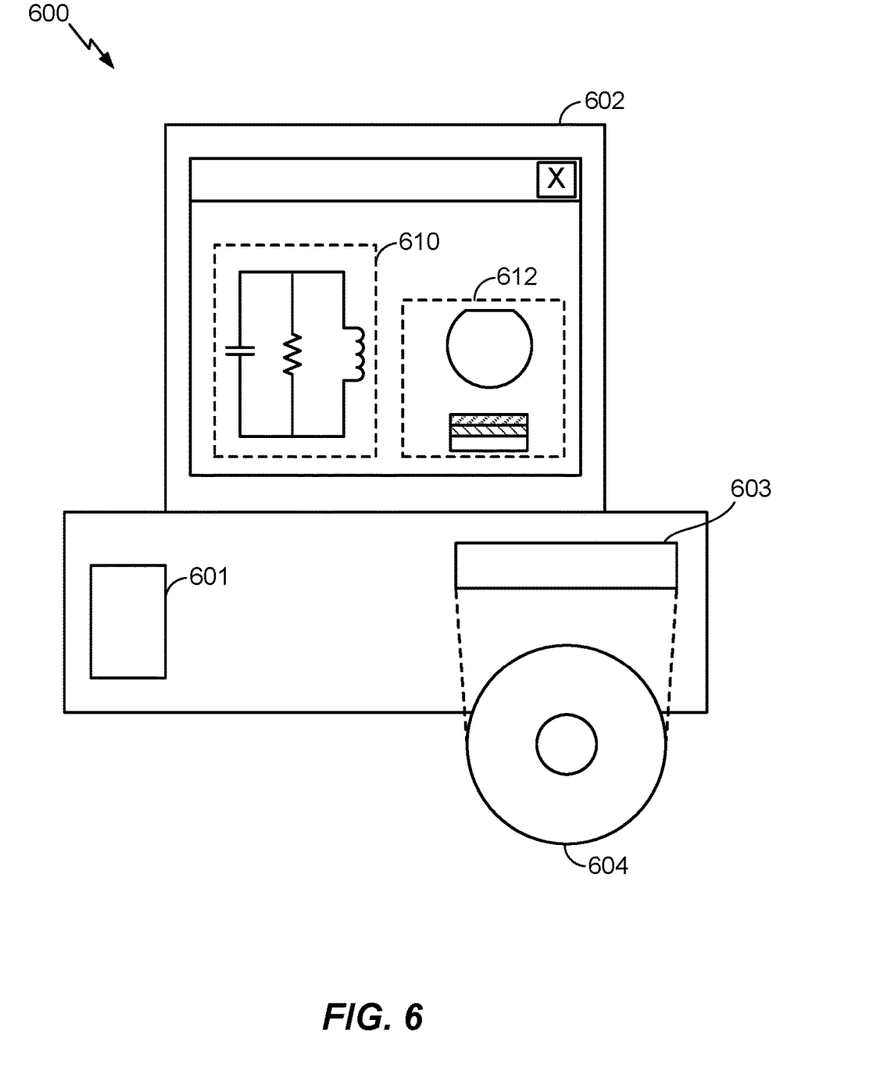
FIG. 6 is a block diagram illustrating a design workstation used for circuit, layout, and logic design of a semiconductor component according to one configuration.

FIG. 6 is a block diagram illustrating a design workstation used for circuit, layout, and logic design of a semiconductor component, such as the MOM capacitors disclosed above. A design workstation 600 includes a hard disk 601 containing operating system software, support files, and design software such as Cadence or OrCAD. The design workstation 600 also includes a display 602 to facilitate design of a circuit 610 or a MOM capacitor 612. A storage medium 604 is provided for tangibly storing the design of the circuit 610 or the MOM capacitor 612. The design of the circuit 610 or the MOM capacitor 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit 610 or the MOM capacitor 612 by decreasing the number of processes for designing semiconductor wafers.

According to a further aspect of the present disclosure, a capacitor structure is disclosed. In one configuration, the capacitor structure includes first means for storing charge on a semiconductor substrate. The first means may be the polysilicon structure 112. The capacitor structure also includes second means for storing charge on the semiconductor substrate. The second means may be the MD interconnects 108. In another aspect, the aforementioned means may be any module or any apparatus configured to perform the functions recited by the aforementioned means.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A capacitor, comprising:
   a first set of conductive fingers interdigitated with a second set of conductive fingers at an interconnect layer in a preferred direction of the interconnect layer;
   the first set of conductive fingers interdigitated with the second set of conductive fingers at a next interconnect layer in the preferred direction of the next interconnect layer;
   the first set of conductive fingers interdigitated with the second set of conductive fingers at a subsequent interconnect layer, orthogonal to the preferred direction of the next interconnect layer;
   a first set of through finger vias electrically coupling the first set of conductive fingers of the interconnect layer to the first set of conductive fingers of the next interconnect layer and the first set of conductive fingers of the subsequent interconnect layer as a first terminal of the capacitor without an endcap coupled to the next interconnect layer; and
   a second set of through finger vias electrically coupling the second set of conductive fingers of the interconnect layer to the second set of conductive fingers of the next interconnect layer and the second set of conductive fingers of the subsequent interconnect layer as a second terminal of the capacitor with an endcap coupled to the first interconnect layer or the subsequent interconnect layer.

2. The capacitor of claim 1, integrated into a mobile phone, a set top box, a music player, a video player, an entertainment unit, a navigation device, a computer, a handheld personal communication systems (PCS) unit, a portable data unit, and/or a fixed location data unit.

3. A method for fabricating a capacitor structure, comprising:
   fabricating a first set of conductive fingers interdigitated with a second set of conductive fingers at an interconnect layer in a preferred direction of the interconnect layer;
   fabricating the first set of conductive fingers interdigitated with the second set of conductive fingers at a next interconnect layer in the preferred direction of the next interconnect layer;

fabricating the first set of conductive fingers interdigitated with the second set of conductive fingers at a subsequent interconnect layer, orthogonal to the preferred direction of the next interconnect layer;

electrically coupling the first set of conductive fingers of the interconnect layer to the first set of conductive fingers of the next interconnect layer and the first set of conductive fingers of the subsequent interconnect layer with a first set of through finger vias as a first terminal of the capacitor without an endcap coupled to the next interconnect layer; and electrically coupling the second set of conductive fingers of the interconnect layer to the second set of conductive fingers of the next interconnect layer and the second set of conductive fingers of the subsequent interconnect layer with a second set of through finger vias as a second terminal of the capacitor structure with an endcap coupled to the interconnect layer or the subsequent interconnect layer.

4. The method of claim 3, in which the capacitor structure is integrated into a mobile phone, a set top box, a music player, a video player, an entertainment unit, a navigation device, a computer, a hand-held personal communication systems (PCS) unit, a portable data unit, and/or a fixed location data unit.

5. A 3D mesh capacitor structure, comprising:
a first set of conductive fingers interdigitated with a second set of conductive fingers at an interconnect layer in a preferred direction of the interconnect layer;
the first set of conductive fingers interdigitated with the second set of conductive fingers at a next interconnect layer in the preferred direction of the next interconnect layer;
the first set of conductive fingers interdigitated with the second set of conductive fingers at a subsequent interconnect layer, orthogonal to the preferred direction of the next interconnect layer;
a first set of through finger vias electrically coupling the first set of conductive fingers of the interconnect layer to the first set of conductive fingers of the next interconnect layer and the first set of conductive fingers of the subsequent interconnect layer in a first 3D mesh as a first terminal of the 3D mesh capacitor without an endcap coupled to the next interconnect layer; and
a second set of through finger vias electrically coupling the second set of conductive fingers of the interconnect layer to the second set of conductive fingers of the next interconnect layer and the second set of conductive fingers of the subsequent interconnect layer in a second 3D mesh as a second terminal of the 3D mesh capacitor with an endcap coupled to the interconnect layer or the subsequent interconnect layer.

6. The 3D mesh capacitor structure of claim 5, further comprising the first set of conductive fingers interdigitated with the second set of conductive fingers at a further interconnect layer, orthogonal to the preferred direction of the subsequent interconnect layer and electrically coupled to the subsequent interconnect layer through the first set of through finger vias and the second set of the through finger vias.

7. The 3D mesh capacitor structure of claim 6, in which the first set of conductive fingers are electrically coupled as the first terminal of the 3D mesh capacitor structure, and the second set of conductive fingers are electrically coupled as the second terminal of the 3D mesh capacitor structure.

8. The 3D mesh capacitor structure of claim 5, integrated into a mobile phone, a set top box, a music player, a video player, an entertainment unit, a navigation device, a computer, a hand-held personal communication systems (PCS) unit, a portable data unit, and/or a fixed location data unit.

9. A capacitor, comprising:
a first set of conductive fingers interdigitated with a second set of conductive fingers at an interconnect layer in a preferred direction of the interconnect layer;
the first set of conductive fingers interdigitated with the second set of conductive fingers at a next interconnect layer in the preferred direction of the next interconnect layer;
the first set of conductive fingers interdigitated with the second set of conductive fingers at a subsequent interconnect layer, orthogonal to the preferred direction of the next interconnect layer;
first means for electrically coupling the first set of conductive fingers of the interconnect layer to the first set of conductive fingers of the next interconnect layer and the first set of conductive fingers of the subsequent interconnect layer as a first terminal of the capacitor without an endcap coupled to the next interconnect layer; and
second means for electrically coupling the second set of conductive fingers of the interconnect layer to the second set of conductive fingers of the next interconnect layer and the second set of conductive fingers of the subsequent interconnect layer as a second terminal of the capacitor with an endcap coupled to the interconnect layer or the subsequent interconnect layer.

10. The capacitor of claim 9, integrated into a mobile phone, a set top box, a music player, a video player, an entertainment unit, a navigation device, a computer, a hand-held personal communication systems (PCS) unit, a portable data unit, and/or a fixed location data unit.

* * * * *